(12) United States Patent
Kuo et al.

(10) Patent No.: US 11,935,880 B2
(45) Date of Patent: Mar. 19, 2024

(54) DYNAMIC RANDOM ACCESS MEMORY DEVICE

(71) Applicant: ADATA TECHNOLOGY CO., LTD., New Taipei (TW)

(72) Inventors: Tsung-Hsing Kuo, Taipei (TW); Wen-Tsung Chen, New Taipei (TW); Yu-Ning Lee, New Taipei (TW); Tzu-Jan Tai, Hsinchu County (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 794 days.

(21) Appl. No.: 17/044,420

(22) PCT Filed: Jan. 30, 2019

(86) PCT No.: PCT/CN2019/073840
§ 371 (c)(1),
(2) Date: Oct. 1, 2020

(87) PCT Pub. No.: WO2020/154940
PCT Pub. Date: Aug. 6, 2020

(65) Prior Publication Data
US 2021/0035964 A1 Feb. 4, 2021

(51) Int. Cl.
*H01L 25/16* (2023.01)
*F21V 8/00* (2006.01)
*H01L 33/58* (2010.01)

(52) U.S. Cl.
CPC .......... *H01L 25/167* (2013.01); *G02B 6/0041* (2013.01); *G02B 6/0076* (2013.01);
(Continued)

(58) Field of Classification Search
CPC ..... H01L 25/167; H01L 25/165; H01L 33/58; G02B 6/0041; G02B 6/0076; G02B 6/0091
(Continued)

(56) References Cited

U.S. PATENT DOCUMENTS 7,727,846 B2   6/2010  Ohnuma et al.
9,513,487 B2  12/2016  Shinkai et al.
(Continued)

FOREIGN PATENT DOCUMENTS

CN   101335188 A   12/2008
CN   203134376 U    8/2013
(Continued)

OTHER PUBLICATIONS

WIPO, International Search Report dated Oct. 24, 2019.

*Primary Examiner* — Ori Nadav
(74) *Attorney, Agent, or Firm* — Li & Cai Intellectual Property (USA) Office

(57) ABSTRACT

A dynamic random access memory (DRAM) device is provided. The DRAM device includes a circuit substrate, a light emitting element, a first light-permeable thermal dissipation element, and a first light blocking element. At least one DRAM chip is disposed on the circuit substrate. The light emitting element is disposed on the circuit substrate and coupled to the circuit substrate. The first light-permeable thermal dissipation element is disposed on the circuit substrate. The first light blocking element is disposed between the first light-permeable thermal dissipation element and the circuit substrate, and the first light blocking element is disposed on the first light-permeable thermal dissipation element.

8 Claims, 14 Drawing Sheets

(52) U.S. Cl.
CPC .......... *G02B 6/0091* (2013.01); *H01L 25/165* (2013.01); *H01L 33/58* (2013.01); *H01L 2933/0091* (2013.01)

(58) Field of Classification Search
USPC .......................................................... 257/98
See application file for complete search history.

(56) References Cited

U.S. PATENT DOCUMENTS

| | | | |
|---|---|---|---|
| 10,288,791 B2 | 5/2019 | Tseng et al. | |
| 10,809,452 B2 * | 10/2020 | Huang | H05K 1/0274 |
| 2010/0054053 A1 | 3/2010 | Lee et al. | |
| 2014/0226080 A1 | 8/2014 | Tomomasa et al. | |
| 2017/0142827 A1 * | 5/2017 | Cheng | H05K 1/0274 |

FOREIGN PATENT DOCUMENTS

| | | |
|---|---|---|
| CN | 103502882 A | 1/2014 |
| CN | 203378153 U | 1/2014 |
| CN | 205038966 U | 2/2016 |
| CN | 205122186 U | 3/2016 |
| CN | 205281332 U | 6/2016 |
| CN | 206471121 U | 9/2017 |
| CN | 207216545 U | 4/2018 |
| EP | 3306613 A1 | 4/2018 |
| JP | 201860179 A | 4/2018 |
| JP | 2008235566 A | 10/2018 |
| TW | 201727297 A | 8/2017 |
| TW | I599872 B | 9/2017 |
| WO | 2013035664 A1 | 3/2013 |
| WO | 2015111351 A1 | 7/2015 |

* cited by examiner

DYNAMIC RANDOM ACCESS MEMORY DEVICE

FIELD OF THE DISCLOSURE

The present disclosure relates to a memory device, and more particularly to a dynamic random access memory device.

BACKGROUND OF THE DISCLOSURE

A light emitting diode (hereinafter abbreviated as LED) can be disposed on a conventional dynamic random access memory (hereinafter abbreviated as DRAM), and the LED is electrically connected to a circuit of the DRAM, so as to produce a light-emitting effect.

However, in the conventional DRAM that is integrated with an LED, light generated by the LED can only partially emit the light toward a fixed direction. In addition, when there is a need to change a direction of light emission of the LED, a location of the LED has to be changed and a quantity of the LED increases as well. Further, the conventional DRAM that is integrated with the LED can only generate the light at a specific location, and the DRAM is unable to generate an effect of a diffused light with uniform luminance.

Moreover, as the demand for improving a performance of the conventional DRAM increases, the heat generated by the DRAM increases as the performance of the conventional DRAM increases. Meanwhile, a higher thermal energy can be generated when the LED is directly disposed on the DRAM due to the LED consuming a higher power. However, the operating performance of the DRAM is closely related to the operating temperature. When the DRAM has been used in a high performance mode for a while, the operating temperature of the DRAM increases, thereby causing the operating performance of the DRAM to decrease.

Therefore, how to improve a structural design of the DRAM to generate a diffused light with uniform luminance and improve the thermal dissipation rate of the DRAM has become a critical issue in the industry.

SUMMARY OF THE DISCLOSURE

In response to the above-referenced technical inadequacies, the present disclosure provides a DRAM device.

In one aspect, the present disclosure provides a DRAM device including a circuit substrate, a light emitting element, a first light-permeable thermal dissipation element, and a first light blocking element. At least one DRAM chip is disposed on the circuit substrate. The light emitting element is disposed on the circuit substrate and coupled to the circuit substrate. The first light-permeable thermal dissipation element is disposed on the circuit substrate. The first light blocking element is disposed between the first light-permeable thermal dissipation element and the circuit substrate, and the first light blocking element is disposed on the first light-permeable thermal dissipation element. Therefore, by virtue of "the first light blocking element being disposed between the first light-permeable thermal dissipation element and the circuit substrate, and the first light blocking element being disposed on the first light-permeable thermal dissipation element", the DRAM device provided in the present disclosure is able to generate a diffused light with uniform luminance, and the thermal dissipation rate of the DRAM device provided in the present disclosure can be improved as well.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
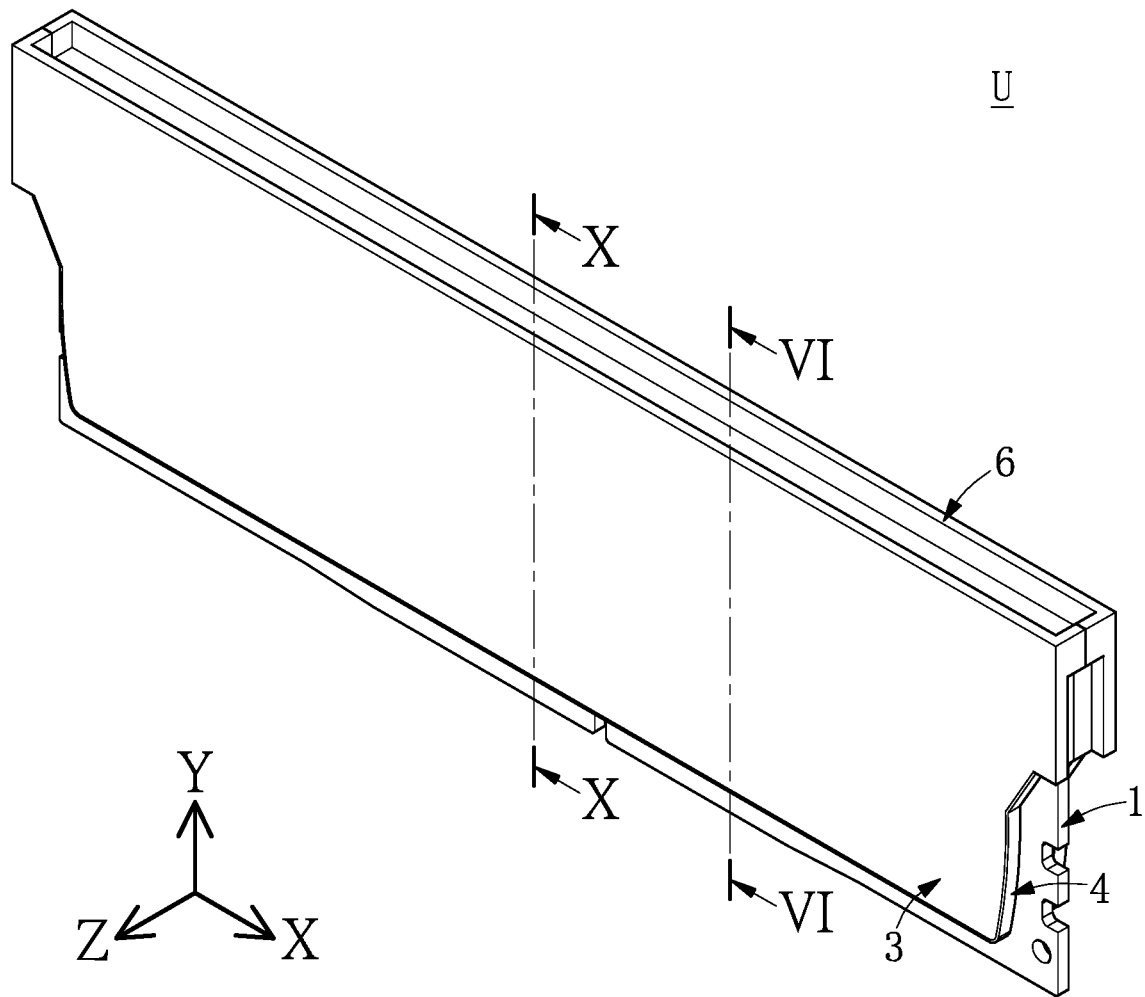
FIG. 1 illustrates an assembled perspective view of a DRAM device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
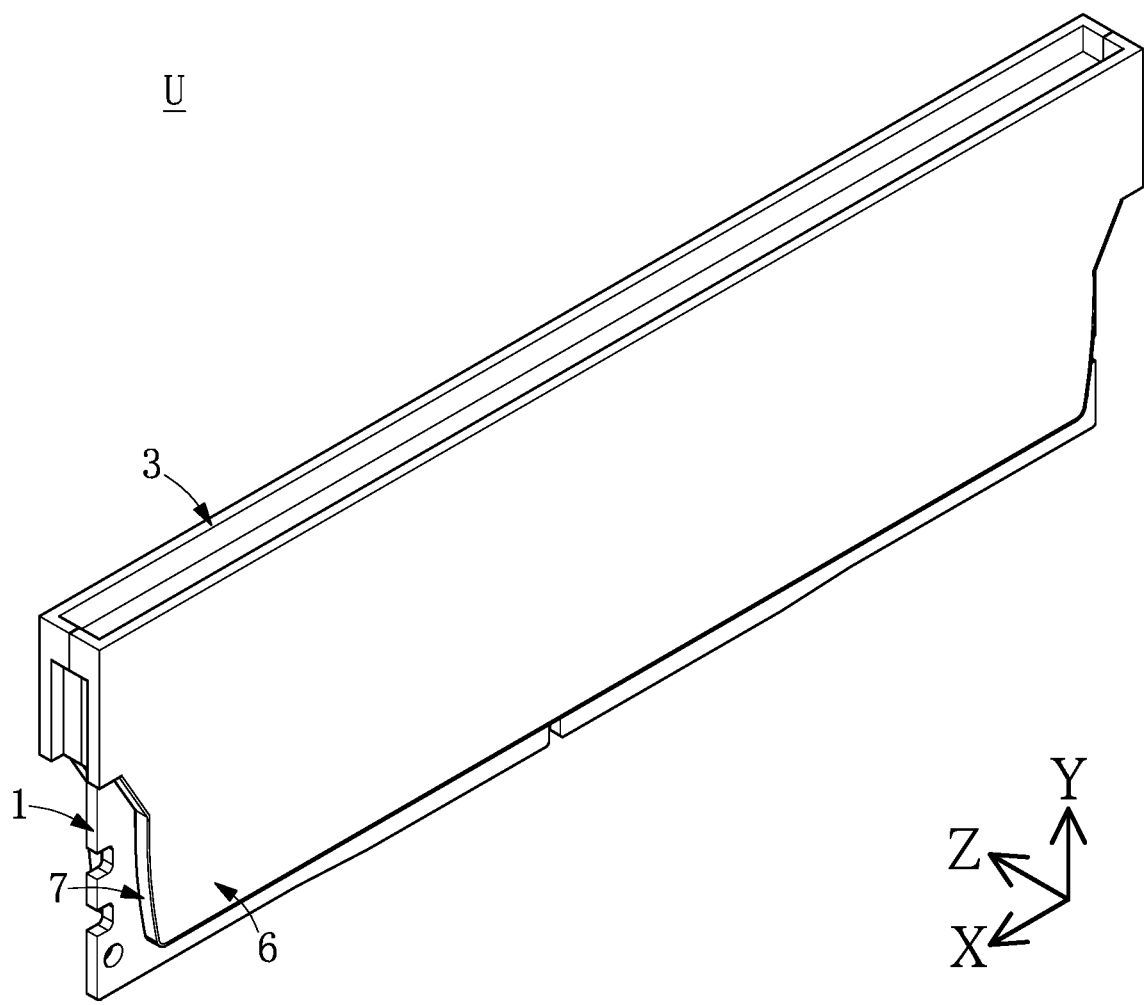
FIG. 2 illustrates another assembled perspective view of the DRAM device according to the first embodiment of the present disclosure.

Referring to FIG. 1 and FIG. 2, a first embodiment of the present disclosure provides a DRAM (dynamic random access memory) device U including a circuit substrate 1, a first light-permeable thermal dissipation element 3 disposed at one side of the circuit substrate 1, and a second light-permeable thermal dissipation element 6 disposed at another side of the circuit substrate 1. With this structure, a thermal dissipation rate of the DRAM device U can be increased by the first light-permeable thermal dissipation element 3 and the second light-permeable thermal dissipation element 6.

Figure 3:
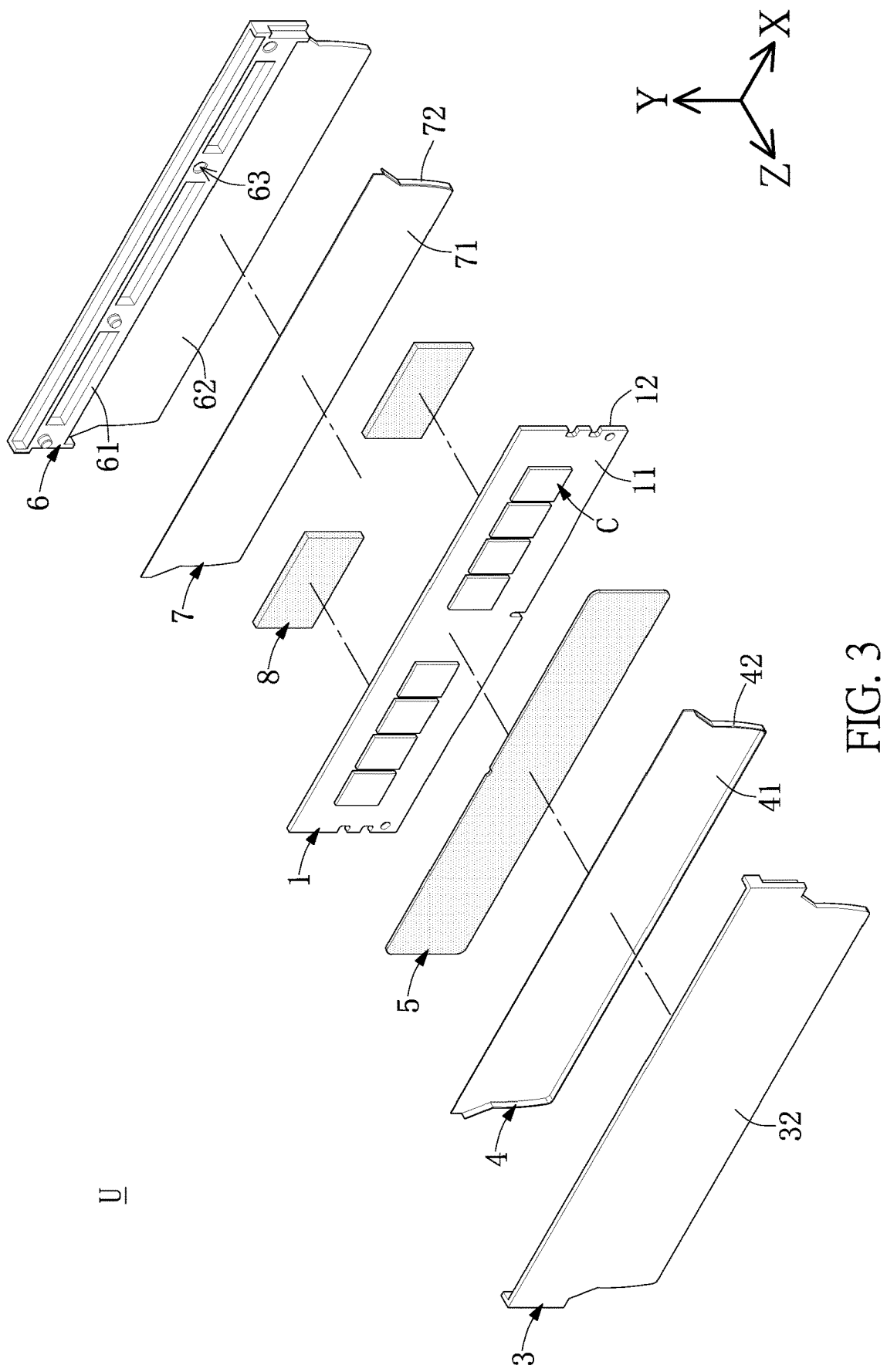
FIG. 3 illustrates an exploded perspective view of the DRAM device according to the first embodiment of the present disclosure.
Figure 4:
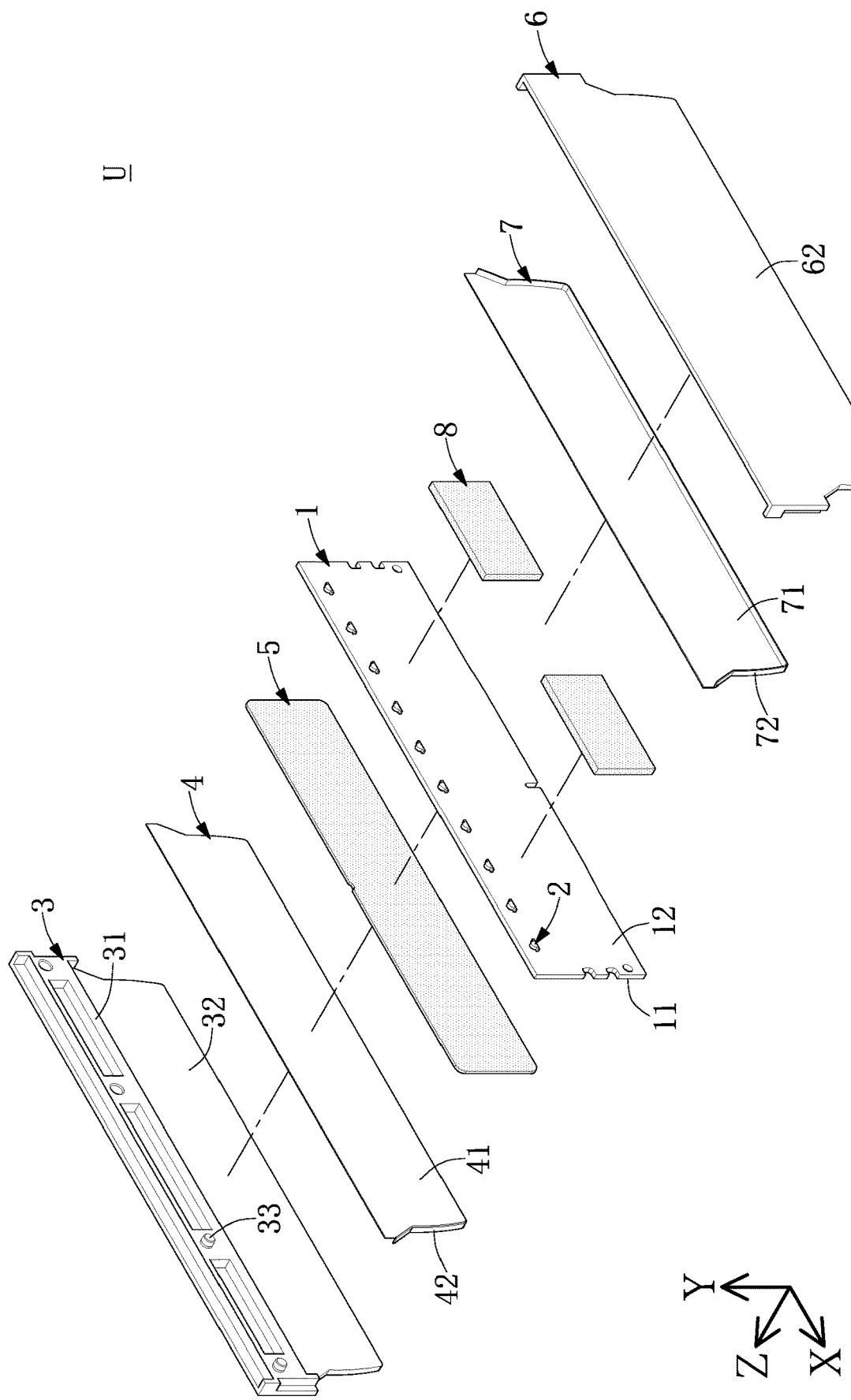
FIG. 4 illustrates another exploded perspective view of the DRAM device according to the first embodiment of the present disclosure.

As shown in FIG. 3 and FIG. 4, in detail, at least one DRAM chip C or a plurality of DRAM chips C may be disposed on the circuit substrate 1, and configured to perform data computation. In addition, it should be noted that a connecting terminal (also known as a gold finger) on the circuit substrate 1 is omitted and not shown in FIG. 3 and FIG. 4 in order to show detailed structure of the DRAM device U. Moreover, it should be noted that the circuit substrate 1 having the at least one DRAM chip C is similar to the conventional DRAM, but the present disclosure is not limited thereto.

The DRAM device U further includes a light emitting element 2 and a first light blocking element 4. Preferably, the DRAM device U further includes a second light-permeable thermal dissipation element 6 and a second light blocking element 7 corresponding to the first light blocking element 4, such that the DRAM device U provided in the first embodiment of the present disclosure can be structurally symmetric. In addition, the circuit substrate 1 includes a first surface 11 and a second surface 12, the at least one DRAM chip C may be disposed on either the first surface 11 or the second surface 12, and the light emitting element 2 may be disposed on either the first surface 11 or the second surface 12. The embodiment of the present disclosure can be provided without limiting which surface the DRAM chip C and the light emitting element 2 are disposed on. In one exemplary embodiment of the present disclosure, the at least one DRAM chip C is disposed on the first surface 11 of the circuit substrate 1, and the light emitting element 2 is disposed on the second surface 12 on the circuit substrate 1. In addition, the present disclosure takes the light emitting element 2 as an LED (light-emitting diode) as an example, but the present disclosure is not limited thereto.

The DRAM chip C and the light emitting element 2 are each coupled to the circuit substrate 1. The first light-permeable thermal dissipation element 3 is disposed on the circuit substrate 1. The first light blocking element 4 is disposed between the first light-permeable thermal dissipation element 3 and the circuit substrate 1, and the first light blocking element 4 is disposed on the first light-permeable thermal dissipation element 3. The second light-permeable thermal dissipation element 6 is disposed on the circuit substrate 1. The second light blocking element 7 is disposed between the second light-permeable thermal dissipation element 6 and the circuit substrate 1, and the second light blocking element 7 is disposed on the second light-permeable thermal dissipation element 6. Further, the first light-permeable thermal dissipation element 3 corresponds to the first light blocking element 4 and both of them are disposed at one side of the circuit substrate 1, the second light-permeable thermal dissipation element 6 corresponds to the second light blocking element 7 and both of them are disposed at another side of the circuit substrate 1. Furthermore, in the first embodiment of the present disclosure embodiment, the first light-permeable thermal dissipation element 3 and the first light blocking element 4 are disposed at the side near the first surface 11 of the circuit substrate 1, and the second light-permeable thermal dissipation element 6 and the second light blocking element 7 are disposed at the other side near the second surface 12 of the circuit substrate 1.

Figure 5:
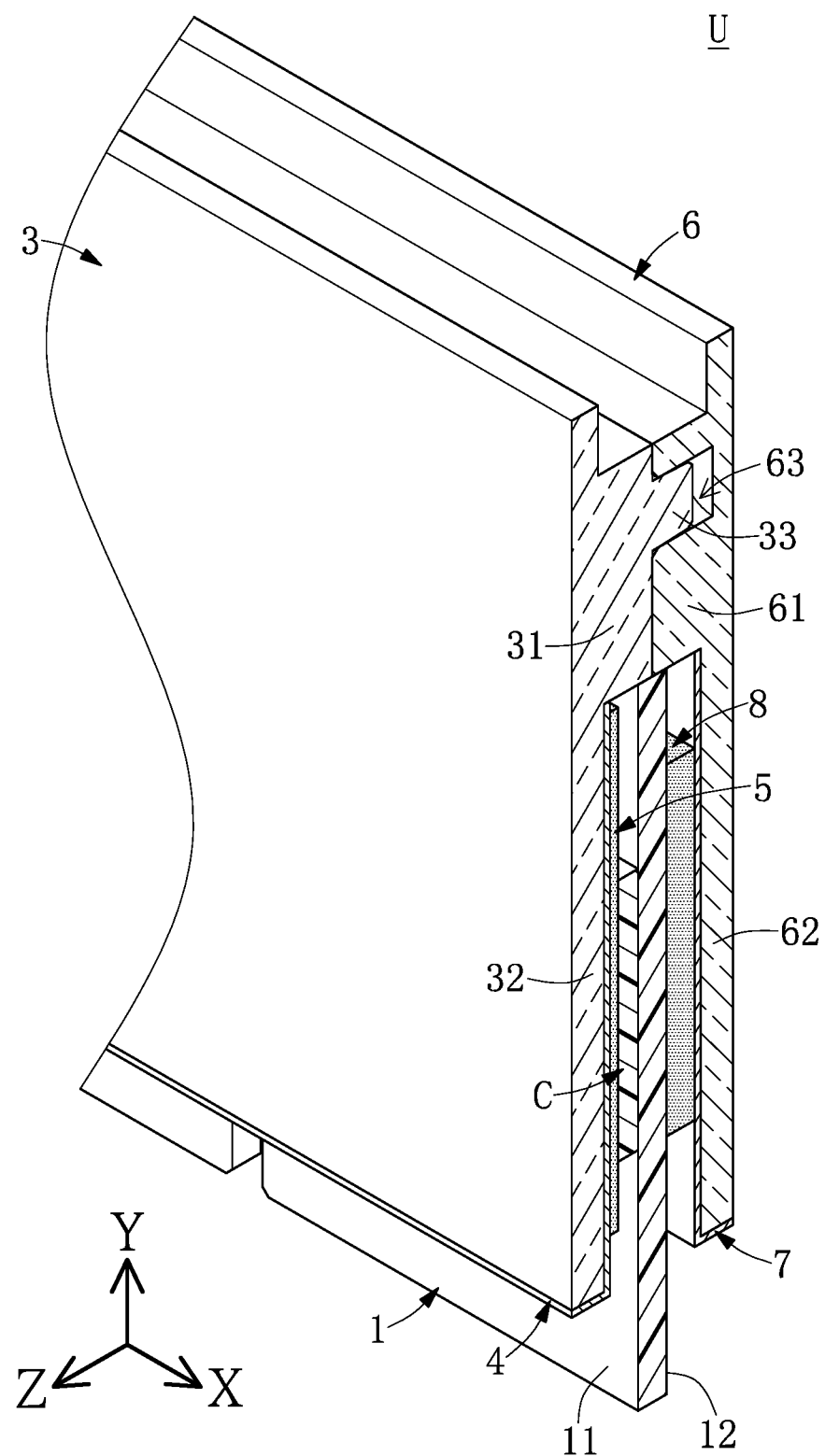
FIG. 5 illustrates a sectional perspective view of the DRAM device according to the first embodiment of the present disclosure.
Figure 6:
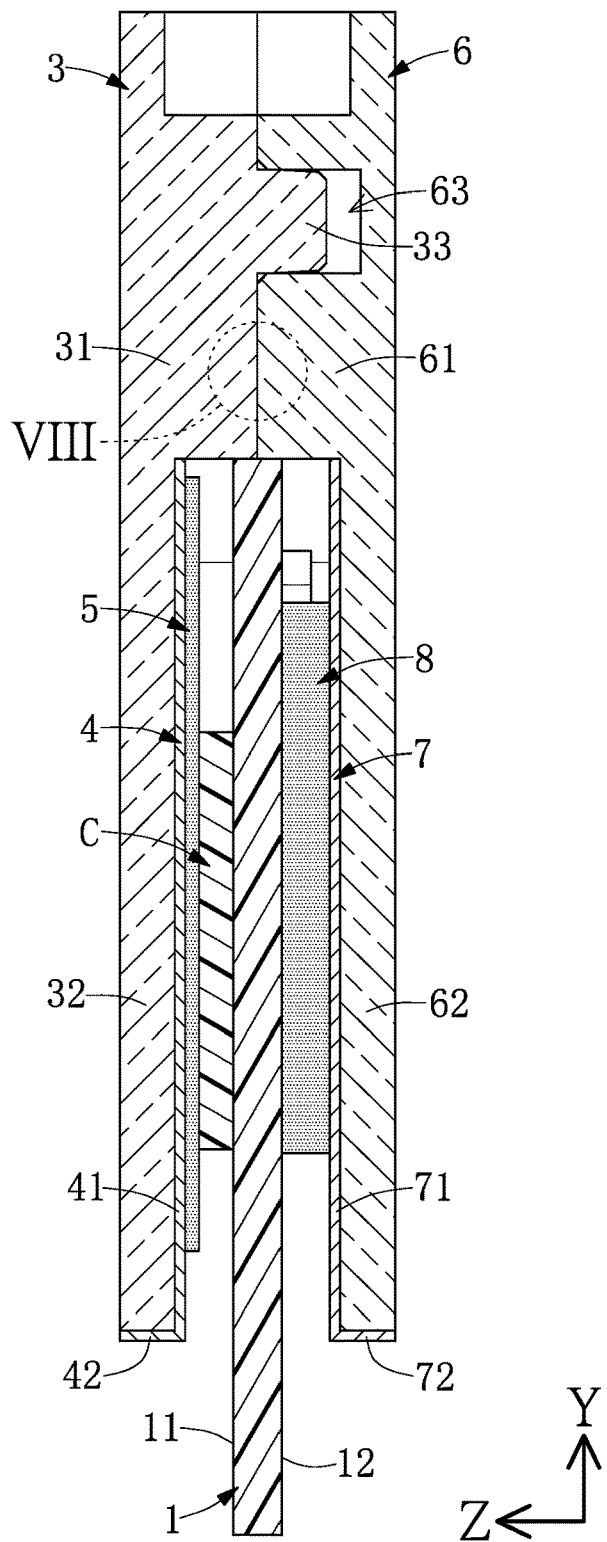
FIG. 6 illustrates a sectional view taken along a cutting line VI-VI of FIG. 1.

Reference is made to FIG. 3 and FIG. 4, which is to be read in conjunction with FIG. 5 and FIG. 6. The first light-permeable thermal dissipation element 3 includes a first light guiding portion 31, a first light uniform portion 32 connected to the first light guiding portion 31, and a first joint portion 33 disposed on the first light guiding portion 31. The second light-permeable thermal dissipation element 6 includes a second light guiding portion 61, a second light uniform portion 62 connected to second light guiding portion 61, and a second joint portion 63 disposed on the second light guiding portion 61 and corresponding to the first joint portion 33. In the first embodiment of the present disclosure, the circuit substrate 1 is disposed between the first light-permeable thermal dissipation element 3 and the second light-permeable thermal dissipation element 6, and the first light-permeable thermal dissipation element 3 is combined with the second light-permeable thermal dissipation element 6 by fitting the first joint portion 33 into the second joint portion 63, such that the first light-permeable thermal dissipation element 3 and the second light-permeable thermal dissipation element 6 can be combined with each other. For example, the first joint portion 33 may be an element having a convex shape (e.g., a knob or a rib), and the second joint portion 63 may be an element having a concave shape (e.g., a hole or a slot), but the present disclosure is not limited thereto.

The DRAM device U provided in the first embodiment of the present disclosure further includes a first thermal conducting element 5 and a second thermal conducting element 8. The first thermal conducting element 5 is disposed between the first light blocking element 4 and the circuit substrate 1, the first light blocking element 4 is adhered to the circuit substrate 1 through the first thermal conducting element 5, and the first thermal conducting element 5 is adhesive. For example, the first thermal conducting element 5 is disposed on the at least one DRAM chip C, the first light blocking element 4 is disposed on the first thermal conducting element 5, and the first light blocking element 4 is combined with the first light-permeable thermal dissipation element 3. With this structure, heat generated by at least one of the at least one DRAM chip C and the light emitting element 2 can pass through the first thermal conducting element 5 and the first light blocking element 4 in a sequential order, and be conducted to the first light-permeable thermal dissipation element 3, such that the thermal dissipation rate of the DRAM device U can be improved. In addition, the second thermal conducting element 8 is disposed between the second light blocking element 7 and the circuit substrate 1, the second light blocking element 7 is adhered to the circuit substrate 1 through the second thermal conducting element 8, and the second thermal conducting element 8 is adhesive. For example, the second thermal conducting element 8 is disposed on the second surface 12 of the circuit substrate 1, the second light blocking element 7 is disposed on the second thermal conducting element 8, and the second light blocking element 7 is combined with the second light-permeable thermal dissipation element 6. With this structure, the heat generated by at least one of the DRAM chip C and the light emitting element 2 can be sequentially conducted from the second thermal conducting element 8 and the second light-permeable thermal dissipation element 6 through the second light blocking element 7, such that the thermal dissipation rate of the DRAM device U can be improved.

For example, at least one of the first thermal conducting element 5 and the second thermal conducting element 8 may be a thermal pad having a certain level of thermal conductivity, in which the thermal conductivity of at least one of the first thermal conducting element 5 and the second thermal conducting element 8 is preferably greater than 6 W/mK, but the present disclosure is not limited thereto. In addition, at least one of the first thermal conducting element 5 and the second thermal conducting element 8 may be, for example but not limited to, a thermal tape, a thermal conductive pad or a double-sided thermal conductive tape, such that the first light blocking element 4 and the second light blocking element 7 are adhered to the circuit substrate 1 through the first thermal conducting element 5 and the second thermal conducting element 8, respectively. In addition, for example, when at least one of the first thermal conducting element 5 and the second thermal conducting element 8 is the double-sided thermal conductive tape, the double-sided thermal conductive tape may be made of glass fiber composite, but the present disclosure is not limited thereto. In addition, it should be noted that the first embodiment of the present disclosure takes disposing the DRAM chip C on the first surface 11 of the circuit substrate 1 as an example. In this case, a thickness of the second thermal conducting element 8 disposed on the second surface 12 of the circuit substrate 1 is preferably greater than a thickness of the first thermal conducting element 5, in order to keep the appearance of the DRAM device U to be structurally symmetric. However, it should be noted that in other embodiments, an object (not shown in the figures) may be disposed between the second surface 12 of the circuit substrate 1 and the second thermal conducting element 8, and the object may be, for example but not limited to, a metal or a sponge having a certain level of thermal conductivity level, in order to keep the appearance of the DRAM device U to be structurally symmetric.

Referring to FIG. 1 to FIG. 6, for example, in the first embodiment of the present disclosure, the first light blocking element 4 includes a first body portion 41 and a first frame portion 42 disposed on the first body portion 41, and the second light blocking element 7 includes a second body portion 71 and a second frame portion 72 disposed on the second body portion 71. In addition, the first frame portion 42 is disposed perpendicular to the first body portion 41, and the first frame portion 42 extends in a direction toward the first light-permeable thermal dissipation element 3 from the first body portion 41. In addition, the second frame portion 72 is disposed perpendicular to the second body portion 71, and the second frame portion 72 extends in a direction toward the second light-permeable thermal dissipation element 6 from the second body portion 71. Further, the first frame portion 42 of the first light blocking element 4 can be combined with the first light-permeable thermal dissipation element 3, and the second frame portion 72 of the second light blocking element 7 can be combined with the second light-permeable thermal dissipation element 6. With this structure, the first light-permeable thermal dissipation element 3 can be combined with the first light blocking element 4, and the combination of the first light-permeable thermal dissipation element 3 and the first light blocking element 4 can be adhered to the circuit substrate 1 through the first thermal conducting element 5. In addition, the second light-permeable thermal dissipation element 6 can be combined with the second light blocking element 7, and the combination of the second light-permeable thermal dissipation element 6 and the second light blocking element 7 can be adhered to the circuit substrate 1 through the second thermal conducting element 8. In addition, it should be noted that in other embodiments, the first light blocking element 4 may be adhered to the first light-permeable thermal dissipation element 3 through a thermal conducting element (not shown in the figures), and the second light blocking element 7 may also be adhered to the second light-permeable thermal dissipation element 6 through a thermal conducting element (not shown in the figures), but the present disclosure is not limited thereto.

Figure 7:
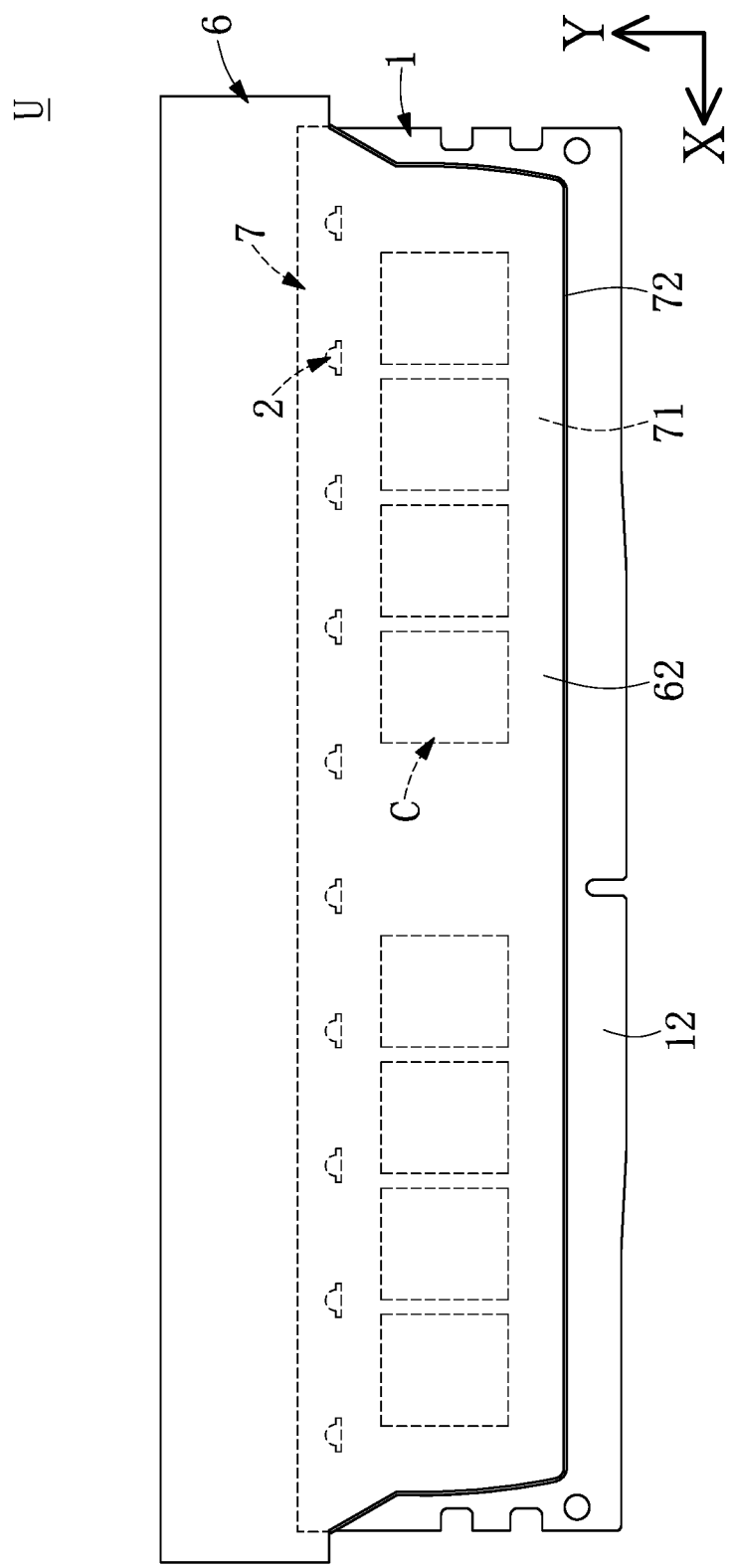
FIG. 7 illustrates a schematic view of a first light-permeable thermal dissipation element of the DRAM device according to the first embodiment of the present disclosure.

Referring to FIG. 7, relative positions of the first light blocking element 4, the second light blocking element 7 and the light emitting element 2 will be described herein. A first projection region can be defined by a vertical projection of the at least one DRAM chip C onto the second surface 12 of the circuit substrate 1, a second projection region can be defined by a vertical projection of the light emitting element 2 onto the second surface 12, a third projection region can be defined by a vertical projection of the second light blocking element 7 onto the second surface 12, and the third projection region covers the first projection region and the second projection region. In other words, in the first embodiment of the present disclosure, the light generated by the light emitting element 2 will not directly emit from at least one of the first light-permeable thermal dissipation element 3 and the second light-permeable thermal dissipation element 6 because a part of the light generated by the light emitting element 2 is blocked by at least one of the first light blocking element 4 and the second light blocking element 7. Furthermore, in the first embodiment of the present disclosure, a transmittance of at least one of the first light blocking element 4 and the second light blocking element 7 may be less than 99%, and a transmittance of at least one of the first light-permeable thermal dissipation element 3 and the second light-permeable thermal dissipation element 6 may be greater than 1%. In addition, for example, a material of at least one of the first light blocking element 4 and the second light blocking element 7 may be made of Mylar®, at least one of the first light-permeable thermal dissipation element 3 and the second light-permeable thermal dissipation element 6 may be made of colored or light-permeable materials. In addition, for example, at least one of the first light-permeable thermal dissipation element 3 and the second light-permeable thermal dissipation element 6 may preferably be a one-piece component made of, such as but not limited to, poly-methyl methacrylate (PMMA) or polycarbonate (PC). However, the present disclosure can be provided without limiting the abovementioned examples.

It should be noted that the present disclosure takes the light emitting element 2 being disposed on the second surface 12 of the circuit substrate 1 for example. However, in other embodiments, the light emitting element 2 may be disposed on the first surface 11 of the circuit substrate 1. Therefore, in other embodiments, a fourth projection region can be defined by a vertical projection of the at least one DRAM chip C onto the first surface 11 of the circuit substrate 1, a fifth projection region can be defined by a vertical projection of the light emitting element 2 onto the first surface 11, a sixth projection region can be defined by a vertical projection of the first light blocking element 4 onto the first surface 11, and the sixth projection region covers the fourth projection region and the fifth projection region.

Figure 8:
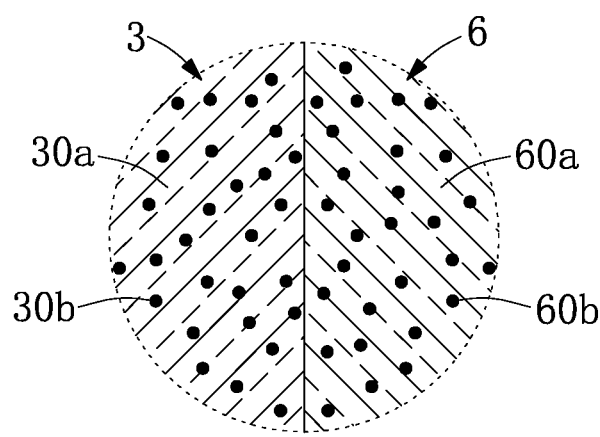
FIG. 8 illustrates an enlarged view of section VIII in FIG. 6.

As shown in FIG. 8, in the first embodiment of the present disclosure, at least one of the first light-permeable thermal dissipation element 3 and the second light-permeable thermal dissipation element 6 may be made of a composite material including plastic (30a, 60a) and diffusion powder (30b, 60b), and a doping concentration of the diffusion powder (30b, 60b) is preferably 1 unit weight to 5 unit weights relative to 100 unit weights of the plastic (30a, 60a). In a more preferable embodiment, the doping concentration of the diffusion powder (30b, 60b) is preferably 1 unit weight to 2 unit weights relative to 100 unit weights of the plastic (30a, 60a). Furthermore, in the first embodiment of the present disclosure, at least one of the first light-permeable thermal dissipation element 3 and the second light-permeable thermal dissipation element 6 is mainly made of plastic. A ratio between the plastic (30b, 60b) of at least one of the first light-permeable thermal dissipation element 3 and the second light-permeable thermal dissipation element 6 and the diffusion powder (30b, 60b) may be 100:1. In addition, the diffusion powder (30b, 60b) may be made of polycarbonate (PC) for example, but the present disclosure is not limited thereto. With this structure, a diffused light with uniform luminance may be generated after a light generated by the light emitting element 2 has passed through at least one of the first light-permeable thermal dissipation element 3 and the second light-permeable thermal dissipation element 6 by selecting a proper weight ratio or ratio between the plastic (30a, 60a) and the diffusion powder (30b, 60b).

Figure 9:
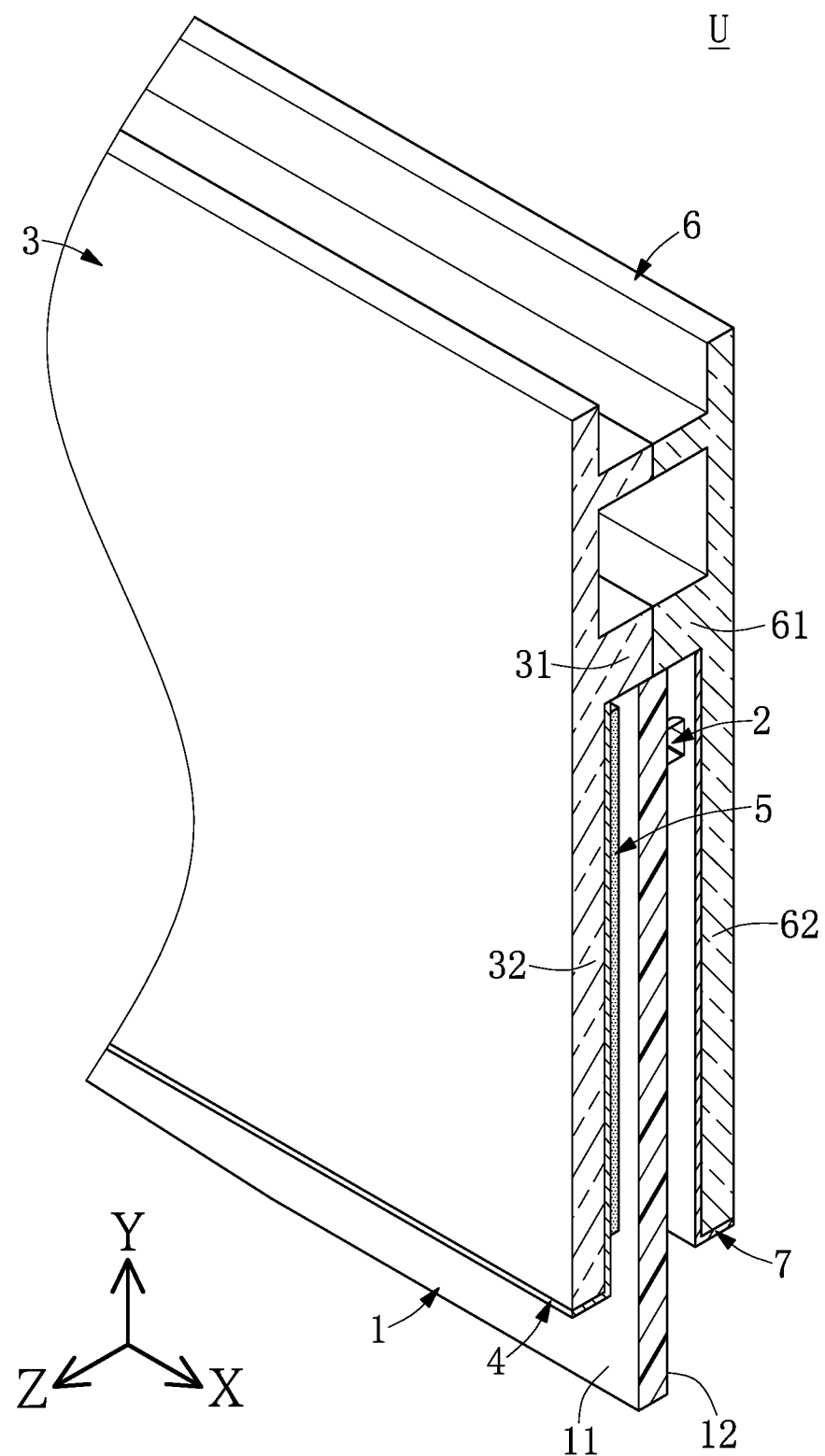
FIG. 9 illustrates another sectional perspective view of the DRAM device according to the first embodiment of the present disclosure.
Figure 10:
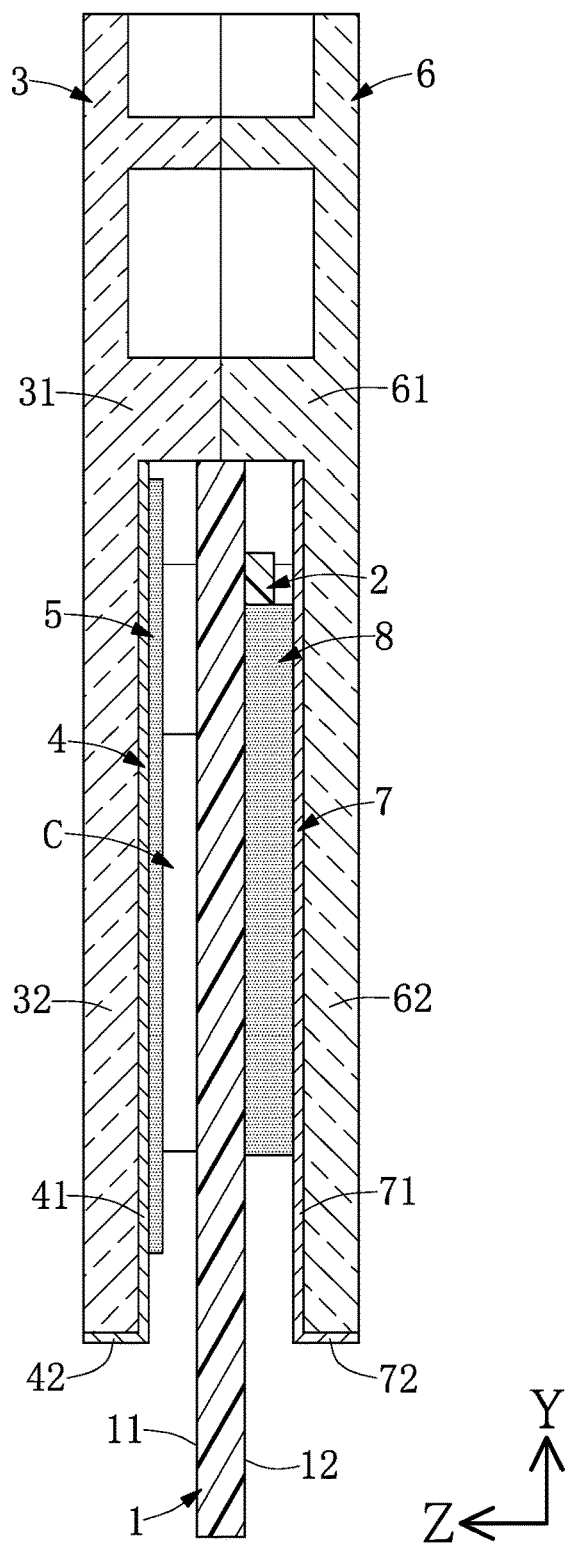
FIG. 10 illustrates a sectional view taken along a cutting line X-X of FIG. 1.
Figure 11:
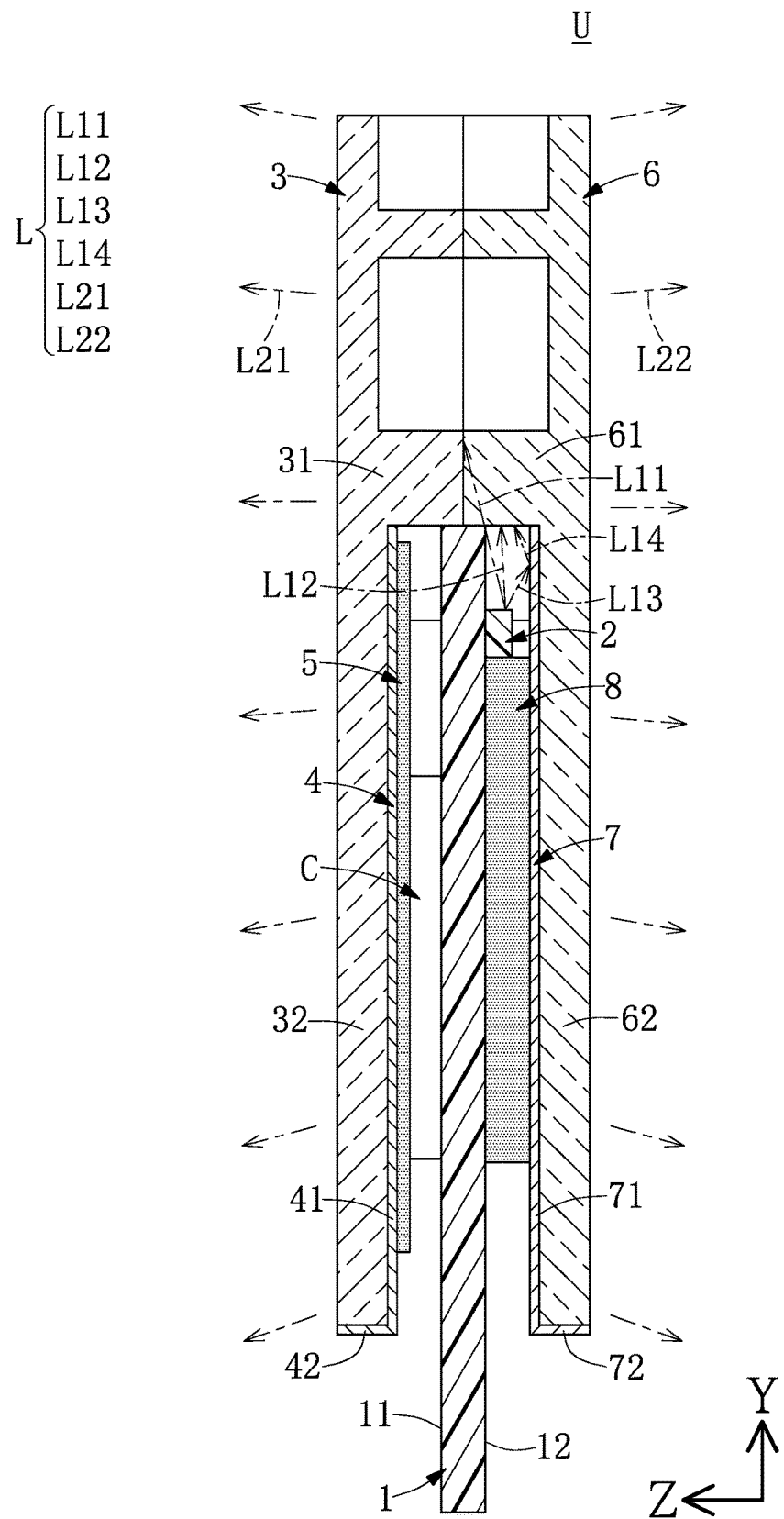
FIG. 11 illustrates a schematic view of a path of a light emitting element of the DRAM device according to the first embodiment of the present disclosure.

Referring to FIG. 9 to FIG. 11, in detail, a light L generated by the light emitting element 2 includes a first incident light L11 projected to the first light guiding portion 31 and a second incident light L12 projected to the second light guiding portion 61. A first scattered light L21 is generated after the first incident light L11 has passed through the first light guiding portion 31 and the first light uniform portion 32, and a second scattered light L22 is generated after the second incident light L12 has passed through the second light guiding portion 61 and the second light uniform portion 62. In other words, since at least one of the first light-permeable thermal dissipation element 3 and the second light-permeable thermal dissipation element 6 is able to transmit lights, the incident light generated by the light emitting element 2 can be transmitted and diffused in at least one of the first light-permeable thermal dissipation element 3 and the second light-permeable thermal dissipation element 6.

As shown in FIG. 11, the light L generated by the light emitting element 2 further includes a third incident light L13, and the third incident light L13 is reflected by the first blocking element 4 to generate a fourth incident light L14 that is projected to at least one of the second light guiding portion 61 and the first light guiding portion 31. In other words, in the first embodiment of the present disclosure, a light emitting plane (e.g., XZ plane) of the light emitting element 2 may be perpendicular to a plane parallel to the first body portion 41 of the first light blocking element 4 and the second body portion 71 of the second light blocking element 7. Therefore, the light L generated by the light emitting element 2 can be directly projected to the second light guiding portion 61 and the first light guiding portion 31. Afterwards, the light is transmitted and diffused in at least one of the first light-permeable thermal dissipation element 3 and the second light-permeable thermal dissipation element 6 to generate diffused light with uniform luminance. It should be noted that, in the first embodiment of the present disclosure, while the light emitting element 2 is disposed on the second surface 12, since the first light-permeable thermal dissipation element 3 and the second light-permeable thermal dissipation element 6 are combined together, the second incident light L12 projected to the second light guiding portion 61 can be indirectly projected to the first light guiding portion 31 through light reflection and diffusion, so as to generate the first incident light L11 that is projected to the first light guiding portion 31.

Second Embodiment

Figure 12:
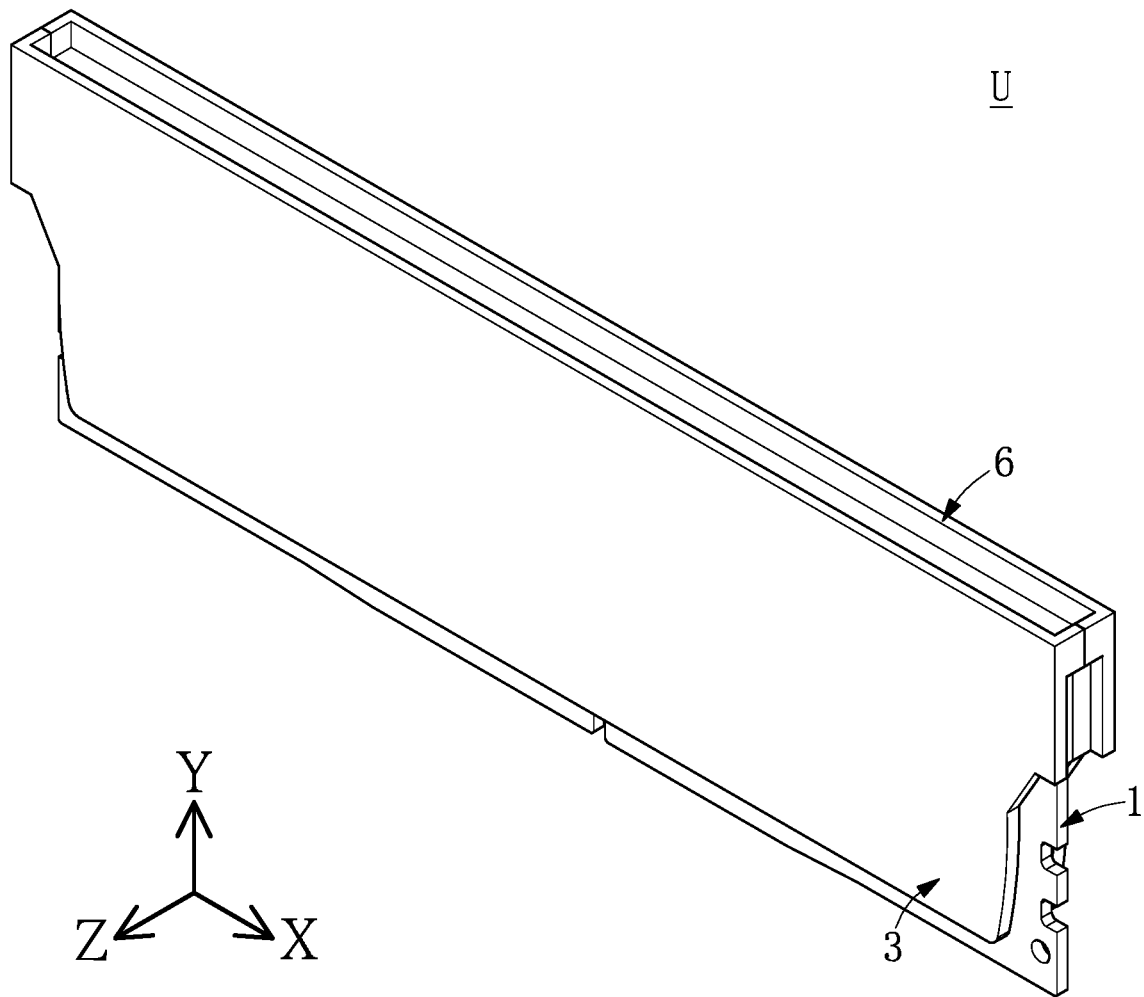
FIG. 12 illustrates an assembled perspective view of a DRAM device according to a second embodiment of the present disclosure.
Figure 13:
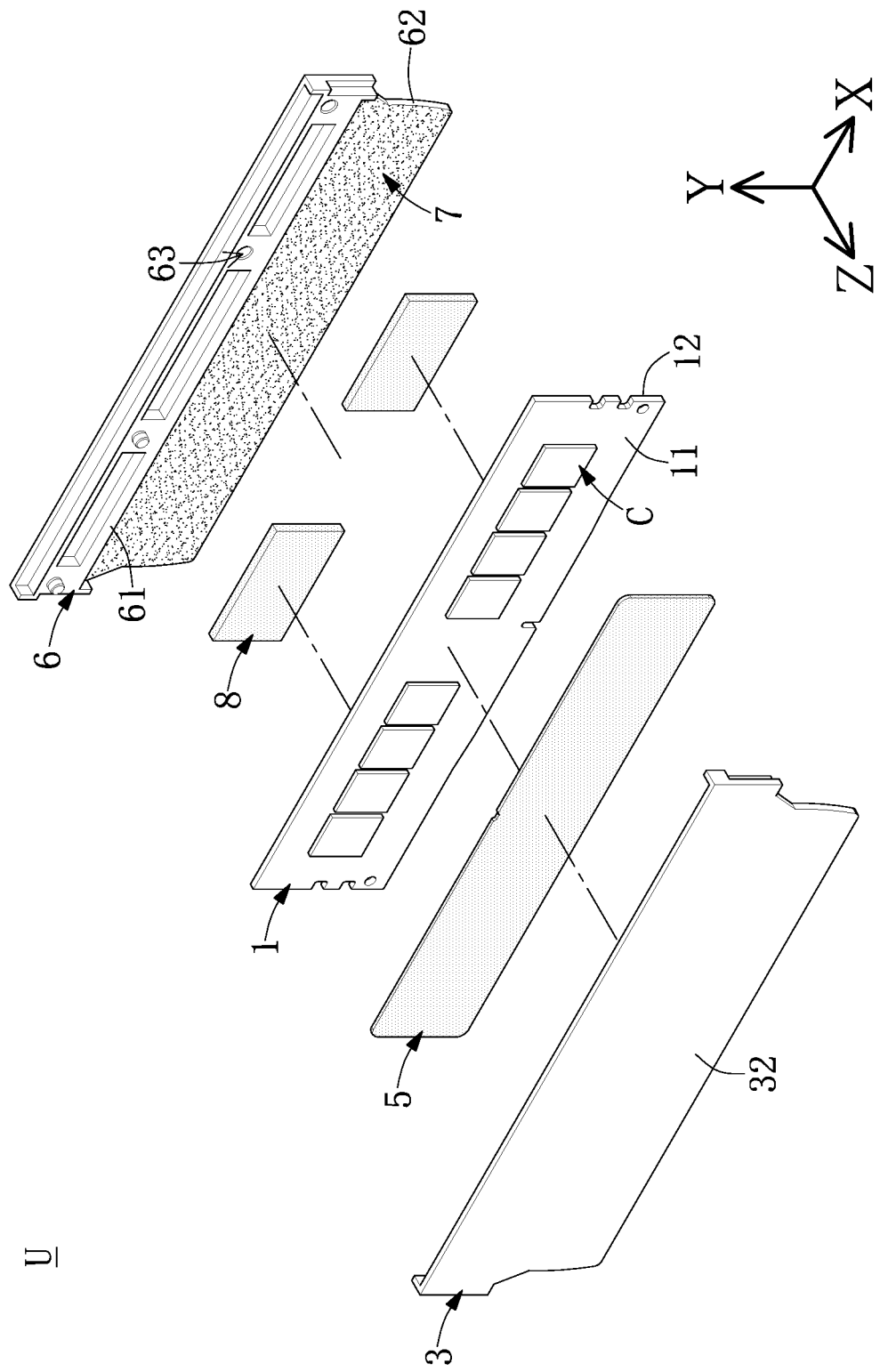
FIG. 13 illustrates an exploded perspective view of the DRAM device according to the second embodiment of the present disclosure.
Figure 14:
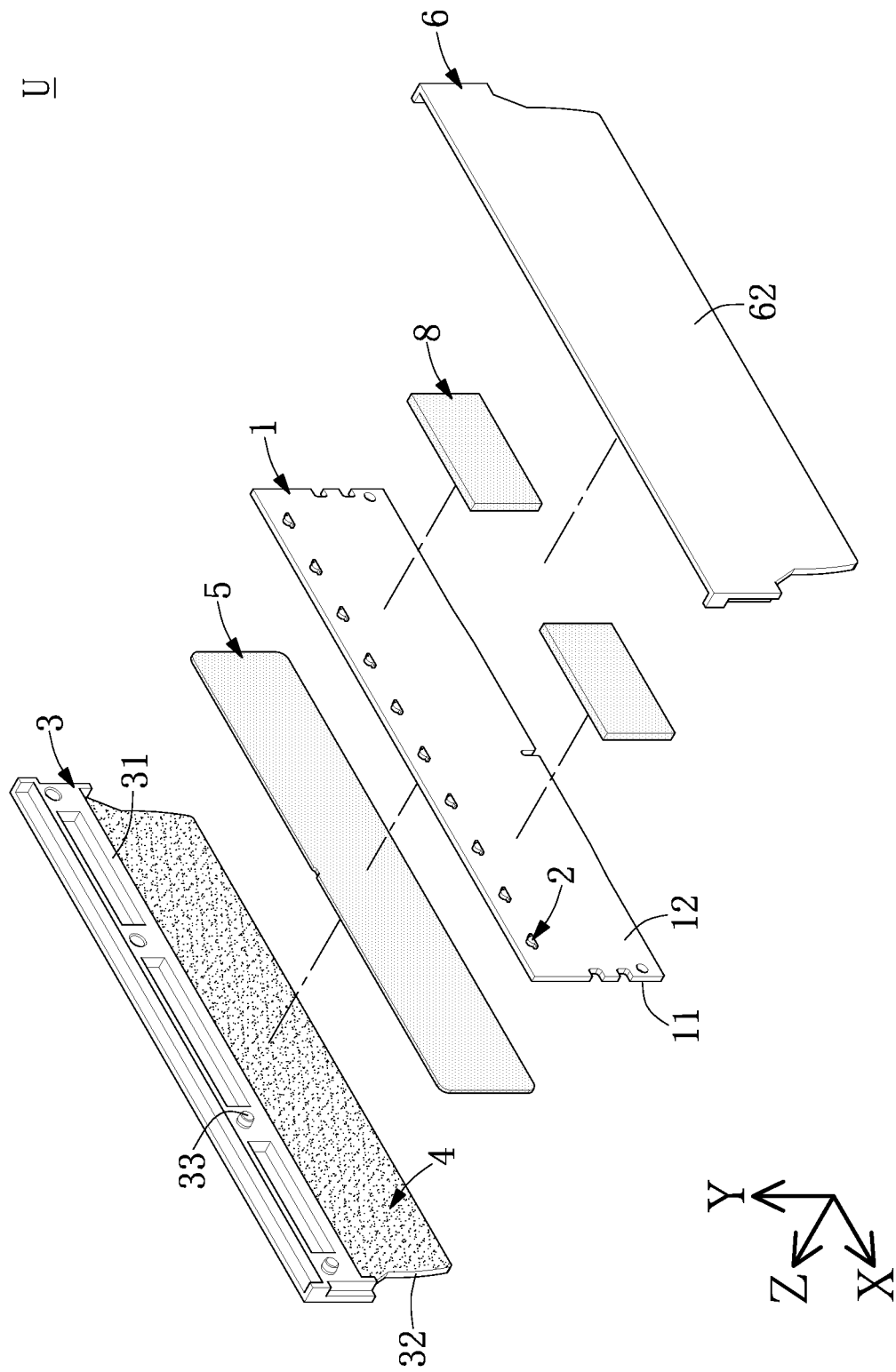
FIG. 14 illustrates another exploded perspective view of the DRAM device according to the second embodiment of the present disclosure.

References are made to FIG. 12 to FIG. 14. As can be learned by comparing FIG. 13 and FIG. 14 with FIG. 3 and FIG. 4, at least one of the first light blocking element 4 and the second light blocking element 7 of the DRAM device U provided in the second embodiment is different from that of the abovementioned first embodiment.

As shown in FIG. 13 and FIG. 14, in the second embodiment of the present disclosure, at least one of the first light blocking element 4 and the second light blocking element 7 may be a coating layer or a coated material, such that a coating layer structure capable of blocking light can be formed by spraying-painting. With this structure, at least one of the first light blocking element 4 and the second light blocking element 7 is capable of light blocking to avoid the light generated by the light emitting element 2 from directly emitting from at least one of the first light-permeable thermal dissipation element 3 and the second light-permeable thermal dissipation element 6.

Advantageous Effect of the Embodiment

Therefore, by virtue of "the first light blocking element 4 being disposed between the first light-permeable thermal dissipation element 3 and the circuit substrate 1, and the first light blocking element 4 being disposed on the first light-permeable thermal dissipation element 3", the DRAM device U provided in the present disclosure is able to generate a diffused light with uniform luminance, and the thermal dissipation rate of the DRAM device U provided in the present disclosure can be improved.

Further, by virtue of "the doping concentration of the diffusion powder (30b, 60b) being 1 unit weight to 5 unit weights relative to 100 unit weights of the plastic (30a, 60a)", at least one of the first light-permeable thermal dissipation element 3 and the second light-permeable thermal dissipation element 6 is able to generate a diffused light with uniform luminance.

Furthermore, by virtue of "a ratio between the plastic (30b, 60b) of at least one of the first light-permeable thermal dissipation element 3 and the second light-permeable thermal dissipation element 6 and the diffusion powder (30b, 60b) being 100:1", at least one of the first light-permeable thermal dissipation element 3 and the second light-permeable thermal dissipation element 6 is able to generate a diffused light with uniform luminance.

Moreover, by virtue of "a first projection region being defined by a vertical projection of the at least one DRAM chip C onto the second surface 12 of the circuit substrate 1, a second projection region being defined by a vertical projection of the light emitting element 2 onto the second surface 12, a third projection region being defined by a vertical projection of second light blocking element 7 onto the second surface 12, and the third projection region covering the first projection region and the second projection region", the second light blocking element 7 can block the light generated by the light emitting element 2 to prevent the light generated by the light emitting element 2 from directly emitting from the second light-permeable thermal dissipation element 6. Meanwhile, at least one of the first light-permeable thermal dissipation element 3 and the second light-permeable thermal dissipation element 6 is utilized to improve an overall effect of a diffused light with uniform luminance.

Furthermore, by virtue of "a fourth projection region being defined by a vertical projection of the at least one DRAM chip C onto the first surface 11 of the circuit substrate 1, a fifth projection region being defined by a vertical projection of the light emitting element 2 onto the first surface 11, a sixth projection region being defined by a vertical projection of the first light blocking element 4 onto the first surface 11, and the sixth projection region covering the fourth projection region and the fifth projection region", the first light blocking element 4 can also block the light generated by the light emitting element 2 to prevent the light generated by the light emitting element 2 from directly emitting from the first light-permeable thermal dissipation element 3. Meanwhile, at least one of the first light-permeable thermal dissipation element 3 and the second light-permeable thermal dissipation element 6 is utilized to improve an overall effect of a diffused light with uniform luminance.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A DRAM (dynamic random access memory) device, comprising:
   a circuit substrate, at least one DRAM chip being disposed on the circuit substrate;
   a light emitting element disposed on the circuit substrate and coupled to the circuit substrate;
   a first light-permeable thermal dissipation element disposed on the circuit substrate, wherein the first light-permeable thermal dissipation element includes:
     a first light guiding portion,
     a first light uniform portion connected to the first light guiding portion, and
     a first joint portion disposed on the first light guiding portion;
   a first light blocking element disposed between the first light-permeable thermal dissipation element and the circuit substrate, and disposed on the first light-permeable thermal dissipation element;
   a second light-permeable thermal dissipation element disposed on the circuit substrate; and
   a second light blocking element being disposed between the second light-permeable thermal dissipation element and the circuit substrate,
     wherein the second light blocking element is disposed on the second light-permeable thermal dissipation element,
     wherein the first light-permeable thermal dissipation element and the first light blocking element are disposed at one side of the circuit substrate, and the second light-permeable thermal dissipation element and the second light blocking element are disposed at another side of the circuit substrate,
     wherein the second light-permeable thermal dissipation element includes:
       a second light guiding portion,
       a second light uniform portion connected to the second light guiding portion, and
       a second joint portion disposed on the second light guiding portion and corresponding to the first joint portion,
     wherein a light generated by the light emitting element includes a first incident light projected to the first light guiding portion and a second incident light projected to the second light guiding portion, a first scattered light being generated after the first incident light has passed through the first light guiding portion and the first light uniform portion, and a second scattered light being generated after the second incident light has passed through the second light guiding portion and the second light uniform portion.

2. The DRAM device of claim 1, wherein the light generated by the light emitting element further includes a third incident light projected to the second light blocking element, the third incident light being reflected by the first light blocking element to generate a fourth incident light projected to at least one of the second light guiding portion and the first light guiding portion.

3. The DRAM device of claim 1, wherein the first light blocking element includes a first body portion and a first frame portion disposed on the first body portion, and the second light blocking element includes a second body portion and a second frame portion disposed on the second body portion; wherein the first frame portion of the first light blocking element is combined with the first light-permeable thermal dissipation element, and the second frame portion of the second light blocking element is combined with the second light-permeable thermal dissipation element.

4. The DRAM device of claim 1, wherein the circuit substrate includes a first surface and a second surface, the at least one DRAM chip being disposed on either the first surface or the second surface, and the light emitting element being disposed on either the first surface or the second surface; wherein a first projection region is defined by a vertical projection of the at least one DRAM chip onto the second surface, a second projection region being defined by a vertical projection of the light emitting element onto the second surface, a third projection region being defined by a vertical projection of the second light blocking element onto the second surface, and the third projection region covering the first projection region and the second projection region.

5. The DRAM device of claim 1, wherein the DRAM device further includes a first thermal conducting element and a second thermal conducting element; wherein the first thermal conducting element is disposed between the first light blocking element and the circuit substrate, the first light blocking element is disposed on the circuit substrate through the first thermal conducting element, and the first thermal conducting element is adhesive; wherein the second thermal conducting element is disposed between the second light blocking element and the circuit substrate, the second light blocking element is disposed on the circuit substrate through the second thermal conducting element, and the second thermal conducting element is adhesive.

6. The DRAM device of claim 1, wherein a transmittance of the first light blocking element is less than 99%, and a transmittance of the first light-permeable thermal dissipation element is greater than 1%.

7. The DRAM device of claim 1, wherein the first light-permeable thermal dissipation element includes a plastic material and a diffusion powder, wherein a doping concentration of the diffusion powder is 1 unit weight to 5 unit weights relative to 100 unit weights of the plastic.

8. The DRAM device of claim 1, wherein the light emitting element is a light emitting diode.

\* \* \* \* \*